(12) United States Patent
Nakayama et al.

(10) Patent No.: US 6,242,787 B1
(45) Date of Patent: *Jun. 5, 2001

(54) SEMICONDUCTOR DEVICE AND MANUFACTURING METHOD THEREOF

(75) Inventors: Yoshiaki Nakayama, Okazaki; Hiroshi Maeda, Kariya; Makio Iida, Ichinomiya; Hiroshi Fujimoto, Nagoya; Mitsuhiro Saitou, Oobu; Hiroshi Imai, Kariya; Hiroyuki Ban, Aichi-ken, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/748,896

(22) Filed: Nov. 15, 1996

(30) Foreign Application Priority Data

Nov. 15, 1995 (JP) ................................... 7-297148
Jan. 22, 1996 (JP) ................................... 8-008699
Sep. 20, 1996 (JP) ................................... 8-250299

(51) Int. Cl.[7] .............................. H01L 29/76; H01L 23/58
(52) U.S. Cl. .................. 257/493; 257/335; 257/337; 257/341; 257/343; 257/492
(58) Field of Search .................. 257/335, 336, 257/337, 341, 343, 347, 350, 351, 491, 492, 493

(56) References Cited

U.S. PATENT DOCUMENTS

| 4,292,642 | 9/1981 | Appels et al. | 257/565 |
|---|---|---|---|
| 4,300,150 | 11/1981 | Colak | 257/493 |
| 4,422,089 | 12/1983 | Vaes et al. | 257/493 |
| 5,705,842 | 1/1998 | Kitamura et al. | |

(List continued on next page.)

FOREIGN PATENT DOCUMENTS

| 0069429 | 1/1983 | (EP) . |
|---|---|---|
| 0 110 320 | 6/1984 | (EP) . |
| 0114435 | 8/1984 | (EP) . |
| 0 267 768 | 5/1988 | (EP) . |
| 0338312 | 10/1989 | (EP) . |
| 0 403 449 | 12/1990 | (EP) . |
| 0 420 672 | 4/1991 | (EP) . |
| 0 566 262 | 10/1993 | (EP) . |

(List continued on next page.)

OTHER PUBLICATIONS

Efland et al: "An Optimized Resurf LDMOS Power Device Module Compatible with advanced Logic processes", IEEE; IEDM 1992– pp. m.237–240.

*Primary Examiner*—Tom Thomas
*Assistant Examiner*—Ori Nadav
(74) *Attorney, Agent, or Firm*—Pillsbury Madison & Sutro LLP (57) ABSTRACT

A semiconductor device including a reduced surface field strength type LDMOS transistor which can prevent the breakdown of elements at channel formation portions when a reverse voltage is applied to its drain. A P well and an N well are formed in an N-type substrate to produce a double-well structure, with a source electrode being set to be equal in electric potential to the N-type substrate. The drift region of the N well has a dopant concentration to satisfy the so-called RESURF condition, which can provide a high breakdown voltage a low ON resistance. When a reverse voltage is applied to a drain electrode, a parasitic bipolar transistor comprising the N well, the P well and the N-type substrate develops to form a current-carrying path toward a substrate, so that the element breakdown at the channel formation portions is avoidable at the application of the reverse voltage.

27 Claims, 11 Drawing Sheets

U.S. PATENT DOCUMENTS

| | | | |
|---|---|---|---|
| 4,494,134 | * 1/1985 | Wildi et al. | 257/273 |
| 4,609,929 | 9/1986 | Jayaraman et al. | 257/493 |
| 4,626,879 | 12/1986 | Colak | 257/493 |
| 4,929,991 | 5/1990 | Blanchard | 357/23.8 |
| 5,014,101 | 5/1991 | Finney | 257/139 |
| 5,072,287 | 12/1991 | Nakagawa et al. | 257/510 |
| 5,119,162 | 6/1992 | Todd et al. | 357/43 |
| 5,286,995 | 2/1994 | Malhi | 257/493 |
| 5,304,827 | 4/1994 | Malhi et al. | 257/325 |
| 5,326,993 | * 7/1994 | Iwamuro | 257/139 |
| 5,338,965 | 8/1994 | Malhi | 257/492 |
| 5,347,155 | 9/1994 | Ludikhuize | 257/492 |
| 5,350,932 | 9/1994 | Malhi | 257/67 |
| 5,369,045 | 11/1994 | Ng et al. | 437/41 |
| 5,382,536 | 1/1995 | Malhi et al. | 437/41 |
| 5,382,818 | 1/1995 | Pein | 257/347 |
| 5,395,776 | 3/1995 | Shibib | 437/40 |
| 5,485,027 | 1/1996 | Williams et al. | |
| 5,514,608 | 5/1996 | Williams | 437/44 |
| 5,517,046 | 5/1996 | Hsing et al. | 257/336 |
| 5,525,824 | 6/1996 | Himi et al. | 257/371 |

OTHER PUBLICATIONS

| | | |
|---|---|---|
| 0 677 876 | 10/1995 | (EP) . |
| 57-078168 | 5/1982 | (JP) . |
| 58-16572 | 1/1983 | (JP) . |
| 59-024550 | 6/1984 | (JP) . |
| 59-119864 | 7/1984 | (JP) . |
| 61-034262 | 8/1986 | (JP) . |
| 62-65382 | 3/1987 | (JP) . |
| 1-050112 | 10/1989 | (JP) . |
| 2-237162 | 9/1990 | (JP) . |
| 5-267652 | 10/1993 | (JP) . |
| 6-318707 | 11/1994 | (JP) . |
| 7-135248 | 5/1995 | (JP) . |
| 07-245398 | 9/1996 | (JP) . |

* cited by examiner

SEMICONDUCTOR DEVICE AND MANUFACTURING METHOD THEREOF

BACKGROUND OF THE INVENTION

1. Field of the Invention

The present invention relates to a semiconductor device with a reduced surface field strength type MOS transistor, a method of manufacturing the same semiconductor device, and a semiconductor device with a load driving semiconductor element such as an LDMOS (Lateral Diffused MOS) transistor (which will be referred hereinafter to as an LDMOS).

2. Description of the Prior Art

Figure 14:
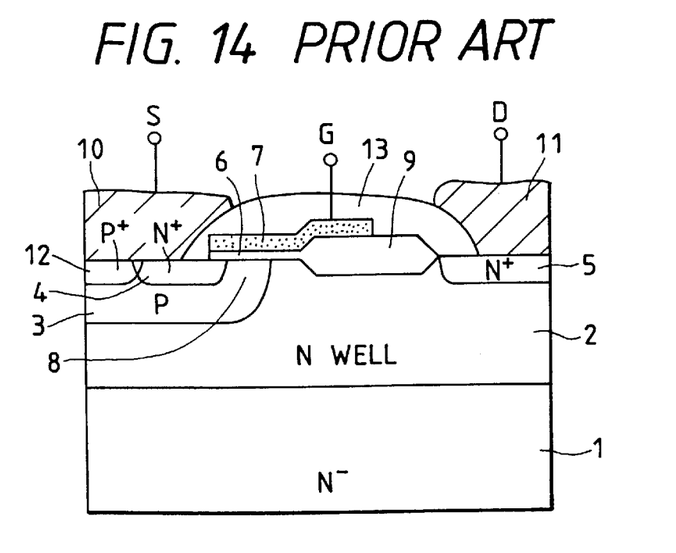
FIG. 14 is a cross-sectional view showing a structure of a prior LDMOS.

As an N-channel LDMOS there has been known an element with a structure as shown in FIG. 14. As illustrated, this LDMOS has an N-type substrate 1, an N well 2 deposited on the N-type substrate 1, a channel P well 3 formed in the N well 2, an N-type diffused layer 4 formed in the channel P well 3 and a different N-type diffused layer 5 provided in the said N well 2. In addition, a gate electrode 7 is located on a substrate surface in a state that a gate oxide film 6 is interposed therebetween while a channel region 8 is formed in a surface area of the channel P well 3 right under the gate electrode 7. In this structure, the N-type diffused layer 4 servers as a source region, the N-type diffused layer 5 acts as a drain region, and the N well 2 under an LOCOS oxide film 9 functions as a drift region. In the illustration, numerals 10 and 11 represent a source electrode and a drain electrode, respectively, numeral 12 designates a diffused layer for taking the electric potential of the channel P well 3, and numeral 13 denotes an inter-layer insulating film.

In the case of such an LDMOS, if the concentration of the N well 2 is heightened in order to reduce the ON resistance to facilitate the current flow, difficulty is encountered to enlarge the depletion layer in the drift region, so that a high breakdown voltage (characteristic bearing a high voltage) becomes unobtainable. On the contrary, if the concentration of the N well 2 falls, although the breakdown voltage improves, the current becomes hard to flow so that the ON resistance increases.

Figure 15:
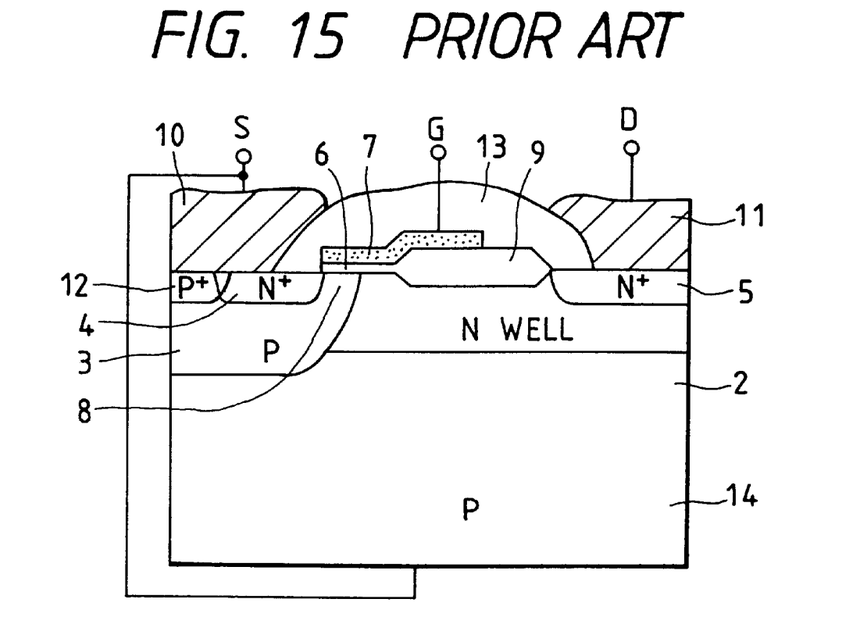
FIG. 15 is a cross-sectional view showing a structure of a prior reduced surface field strength type LDMOS.

One possible solution of such problems is exemplified by Japanese Patent publication No. 59-24550 and Japanese Unexamined Patent Publication No. 5-267652. The outline of the structure disclosed in these publications is that, as shown in FIG. 15, an N well 2 is formed on a P-type substrate 14. In this case, if the formation of the N well 2 is based on the diffusion, the N well 2 surface shows a high concentration, and hence the flow of the current becomes easy in the N well 2 surface, besides the depletion layer can readily enlarge in the whole N well 2, with the result that a high breakdown voltage is attainable. This LDMOS is called a reduced surface field strength type (RESURF=REduced SURface Field) LDMOS where the dopant concentration in the drift region of the N well 2 is determined to satisfy the so-called RESURF condition as described in the above-mentioned publications.

Figure 16:
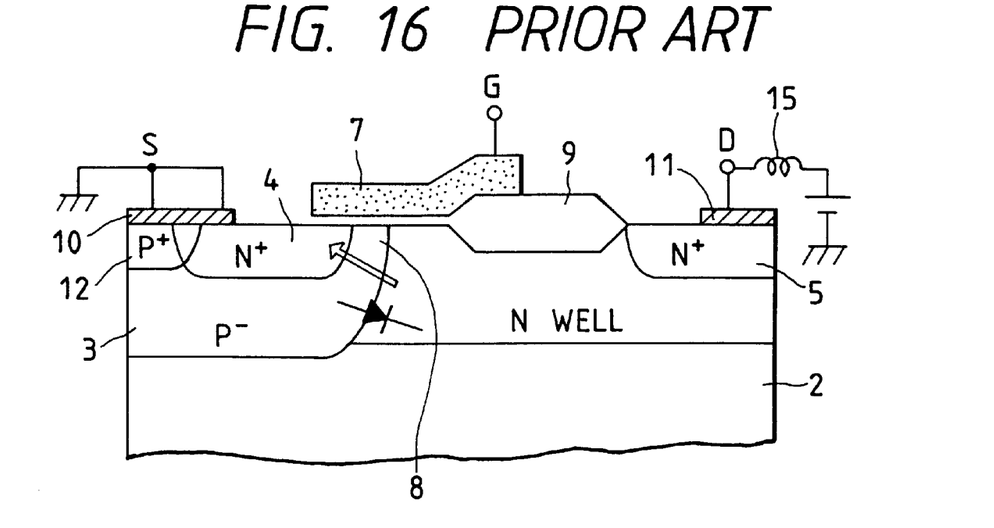
FIG. 16 is an illustration for explaining problems arising at the application of a reverse voltage.

In the aforesaid reduced surface field strength type LDMOS, the drain electrode 11 and the P-type substrate 14 are in an electrically connected relation to each other, and hence, in cases where as shown in FIG. 16 an L load such as a coil 15 is electrically coupled to the drain electrode 11 so that the L load gets into a driven condition, when the voltage applied to the gate electrode 7 comes into the OFF condition, a reverse voltage of the L load 15 has an influence on the drain electrode 11. This reverse voltage can frequently assume an extremely high value. In this case, since the above-mentioned reduced surface field strength type LDMOS does not take into consideration the current escaping path coping with the reverse voltage, the PN junction between the channel P well 3 and the N well 2 comes into breakdown at the application of the reverse voltage to cause a current to flow from the channel P well 3 through a $P^+$ diffused layer 12 to the source electrode 10 so that the electric potential of the channel P well 3 exceeds the electric potential of the N-type diffused layer 4, with the result that a parasitic (incidental) transistor comprising the N-type diffused layer 4 acting as the emitter, the channel P well 3 serving as the base and the N well 2 functioning as the collector comes into operation to cause a large current to flow through a narrow area in an arrow direction. Because of the occurrence of the large current passing through the narrow area, the elements are easy to heat so that the breakdown of the elements takes place irrespective of a low reverse voltage, thus resulting in impairing the breakdown proof of the elements.

Furthermore, the aforesaid reduced surface field strength type LDMOS is situated on the P-type substrate 14, and hence, in the case that a V-NPN transistor (which will be referred hereinafter to as an NPNTr) superior in current characteristic to a PNP transistor and the aforesaid reduced surface field strength type LDMOS are formed on the same substrate, since an N layer serving as a collector layer in the NPNTr is made to take a deep position, difficulty is actually experienced to form both the transistors on the same substrate. In this case, although, if having the structure as shown in FIG. 14, the LDMOS, together with the NPNTr, can be formed on the same substrate, the compatibility of a high breakdown voltage and a low ON resistance as described before become impossible.

Figures 10A, 10B:
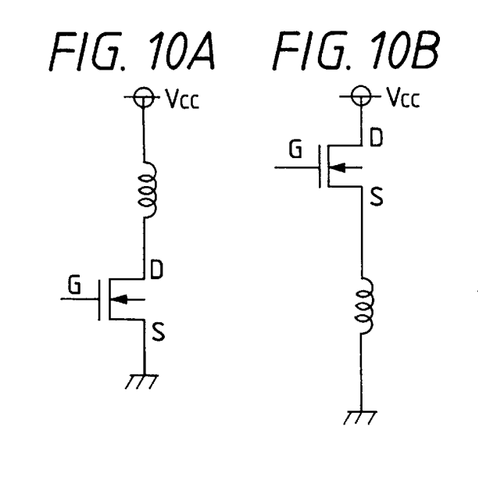
FIGS. 10A to 10E are illustrations of circuit arrangements for driving a load using an LDMOS.

Moreover, there have been proposed various SOI (Silicon On Insulator) structures in which an element area in one main surface side of a semiconductor substrate is divided and separated using an insulating film such as $SiO_2$ to form islands. In this case, elements such as a bipolar transistor and CMOS are formed in the island-like divisions, respectively. The aforesaid power LDMOS is considered to be also formed in the island-like element division. For example, in the case that the LDMOS as shown in FIG. 14 is surrounded by an insulating film, the N-type substrate 1 comes into contact with the insulating film. With this structure, the N-type substrate 1 and the N well 2 becomes common in electric potential to its drain. For this reason, in cases where as shown in FIG. 10A a load is driven by a low side switch type where the load is connected to the power supply side and the LDMOS is coupled to the GND side, in response to the switching of the LDMOS, the drain electric potential varies from the potential of the GND to the potential of the power supply (or more), and the potential of the N-type substrate 1 varies accordingly.

In cases where the element separation is made through the use of the insulating film, since there exists a parasitic capacitor, when the electric potential in the region brought into contact with the insulating film greatly varies, switching noises are propagated up to the other element regions so that the other semiconductor elements can get into malfunction. In the case of the reduced surface field strength type LDMOS as shown in FIG. 15, the P-type substrate 14 comes into contact with the separation insulating film. As illustrated, in order to make the P-type substrate 14 and the source electrode equal in electric potential to each other, the formation of a deep $P^+$ diffused layer for taking the electric potential is necessary. However, in the case that the load is driven by a high side switch type in which as shown in FIG.

10B the LDMOS is connected to the power supply side and the load is coupled to the GND side, in response to the switching of the LDMOS, the source electric potential greatly varies, which can also cause the switching noises.

If, in the SOI structure, elements such as a bipolar transistor and a CMOS of relatively small sizes are formed in the element regions, the aforesaid switching noises does not create a problem. However, in the case of the load driving element such as the LDMOS, the element size increase, thus creating such a problem.

SUMMARY OF THE INVENTION

It is therefore an object of the present invention to provide a reduced surface field strength type LDMOS which is capable of preventing the breakdown of elements at channel forming portions even if its drain undergoes a voltage such as the aforesaid reverse voltage.

Another object of this invention is to form a reduced surface field strength type LDMOS and an NPNTr on the same substrate.

A further object of this invention is to suppress the occurrence of the switching noises when a load driving semiconductor element is provided in an insulated and separated element region.

For the first-mentioned purpose, there is provided a semiconductor device having a reduced surface field strength type MOS transistor in which a semiconductor layer (1) of a first conductivity type supports a first well (16) of a second conductivity type which accommodates a second well (2) of a first conductivity type at a shallower position than the first well (16), and further the second well (2) has a source region (4), a channel region (8) and a drain region (5) therein and a gate electrode (7) is disposed on the channel region (8) so that the second well (2) serves as a drift region, wherein, when a voltage for causing the MOS transistor to be in a non-actuating condition is applied to the gate electrode (7) and a high voltage exceeding a given value is exerted to the drain region, a current-carrying path from the second well (2) through the first well (16) and the semiconductor layer (1) takes place.

Furthermore, the source region (4) and the semiconductor layer (1) are set to be equal in potential to each other. In addition, a parasitic bipolar transistor (18) is formed among the second well (2), the first well (16) and the semiconductor layer (1) to establish the current path. Further, a punch-through occurs between the second well (2) and the semiconductor layer (1) to establish the current path. Still further, a base region (17) is formed to include the source region (4) and to reach the first well (16).

Moreover, there is provided a semiconductor device including a MOS transistor having a source region (4), a channel region (8) and a drain region (5) so that a gate electrode (7) is formed on the channel region and a drift region is set up between the channel region (8) and the drain region (5), wherein a semiconductor layer (1) of a first conductivity type bears a second conductive type first well (16) which in turn accommodates a first conductive type second well (2) at a shallower position than the first well (16), and at least the second well (2) has the drift region and the drain region (5) therein and the source region (4) and the semiconductor region (1) are set to be equal in potential to each other.

According to this invention, the second conductivity type first well and the first conductivity type second well are formed in the first conductivity type semiconductor layer to establish a double-well structure, and the drift region and drain region of the MOS transistor is provided in the second well. In the case that a reverse voltage is applied to the drain region, a current-carrying path is provided in a wide area extending from through the first well and the semiconductor layer. Accordingly, even if such an application of a reverse voltage occurs, this current-carrying path can prevent the breakdown of the elements at the channel formation portions.

For the second-mentioned purpose, there is provided a semiconductor device in which an N-type first semiconductor layer (21a) is divided into first and second element areas so that a reduced surface field strength type MOS transistor (LDMOS) is formed in the first element area while a bipolar transistor (NPNTr) is formed in the second element area in a state that the first semiconductor layer (21a) serves as its collector layer, wherein in the first element area a P-type first well (16) is formed in the first semiconductor layer (21a), an N-type second well (2) is formed in the first well (16) to be shallower than the first well (16) to further accommodate a source region (4), a channel region (8) and a drain region (5), and a gate electrode (7) is located on the channel region (8), so that the reduced surface field strength type MOS transistor is made in a state that the second well (2) acts as a drift region.

Furthermore, an N-type second semiconductor layer (21b) is formed under the first semiconductor layer (21a) and an N-type deep layer (26) is formed which extends from a surface of a substrate to the second semiconductor layer (21b), with the source region (4) and the first semiconductor layer (21a) being set to be equal in potential to each other in such a manner that the potential depends upon the deep layer (26) and the second semiconductor layer (21b).

According to this invention, the P-type first well and the N-type second well are formed in the N-type semiconductor layer to make a double-well structure, thus establishing a reduced surface field strength type MOS transistor. Accordingly, this MOS transistor, together with the NPNTr using the N-type semiconductor layer as the collector layer, can be situated on one substrate.

Still further, in accordance with this invention, there is provided a method of manufacturing a semiconductor device so that in a semiconductor substrate including an N-type semiconductor layer (21a) divided into first and second element areas a reduced surface field strength type MOS transistor (LDMOS) is formed in the first element area while a bipolar transistor (NPNTr) is formed in the second element area, which comprises the steps of performing ion-implantation for the semiconductor layer (21a) to form a P-type first well and an N-type second well (2), performing simultaneous diffusion to form the first well (16) and to form the second well (2) in the first well (16) so that it takes a shallower position than the first well (16), forming a source region (4), a channel region (8) and a drain region (5) within the second well (2), and forming a gate electrode (7) on the channel region (8) to form the MOS transistor (LDMOS) in which the second well (2) serves as a drift region. In addition, the bipolar transistor (NPNTr) is formed in the second element area in a state that the semiconductor layer (21a) acts as a collector layer.

According to this invention, in the manufacturing method of producing the reduced surface field strength type MOS transistor and the NPNTr on the same substrate, the first and second wells are produced by the simultaneous diffusion, with the result that only one mask is required for the formations of the first and second wells.

In the above description, the references within the parentheses signify the corresponding relation to the concrete means in embodiments which will be explained later.

Still further, in accordance with this invention, there is provided a semiconductor device in which a load driving semiconductor element is formed in a insulated and separated element region and an electric potential fixing region for surrounding the semiconductor element is defined between the semiconductor element and an insulating film. Because of surrounding the semiconductor element by the electric potential fixing region, the electric potential variation at the load driving is suppressible to control the occurrence of the switching noises.

In addition, there is provided a semiconductor device in which, when a reverse voltage is applied to a drain region, a current-carrying path is formed to extend from a second well through a first well, a first semiconductor layer and an electric potential fixing region. The formation of this current-carrying path can prevent the breakdown of the elements in the channel formation section at the application of the reverse voltage. Further, the first well is set to be equal in electric potential to the source. This enables further suppressing the occurrence of the switching noises at the electric potential variation.

Furthermore, in the case that an MOS transistor is used for the high side switch type, the electric potential fixing region is connected to the power supply, and when the MOS transistor is used for the low side switch type, the electric potential fixing region is coupled to the ground. In this case, if the electric potential fixing region is made to be selectively coupled to one of the power supply and the ground, one of the low side switch type and the high side switch type can freely undergo selection.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Referring now to the drawings, a description will be made hereinbelow of embodiments of the present invention.

Figure 1:
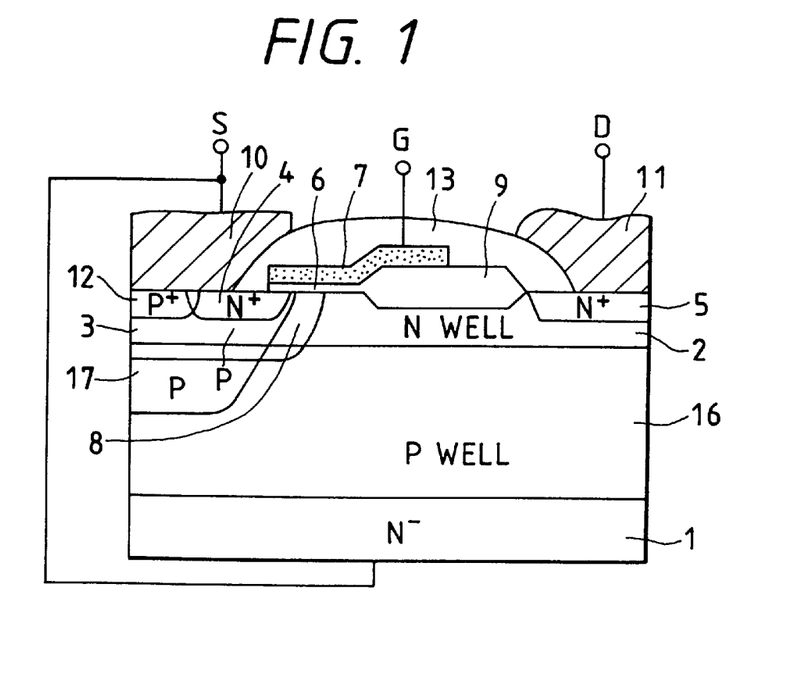
FIG. 1 is a cross-sectional view showing a reduced surface field strength type LDMOS according to an embodiment of the present invention.

FIG. 1 is a cross-sectional view showing a structure of a reduced surface field strength type LDMOS according to an embodiment of the present invention. In this embodiment, as shown in FIG. 1 a P well 16 is disposed on an N-type Substrate and an N well 2 is formed in the P well 16 to thereby produce a double-well structure, with a source electrode 10 and the N-type substrate 1 being made to be equal in electric potential to each other. In a drift region of the N well 2, the dopant concentration is set to satisfy the so-called RESURF condition. Further, In the illustration, parts marked with the same reference numerals as those in FIGS. 8 and 9 have the same or corresponding structures.

Figure 2:
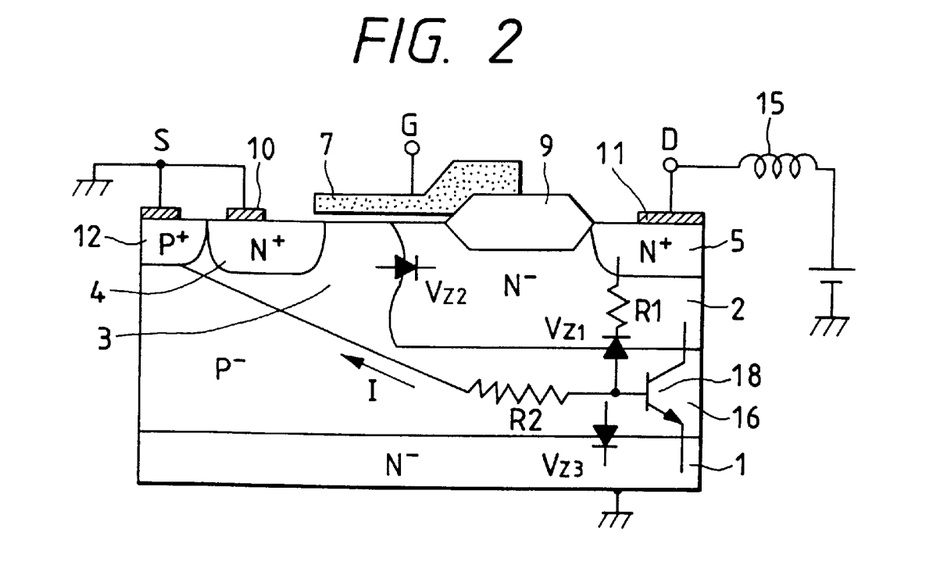
FIG. 2 is an illustration of the FIG. 1 structure useful for describing an operation at the application of a reverse voltage.
Figure 3:
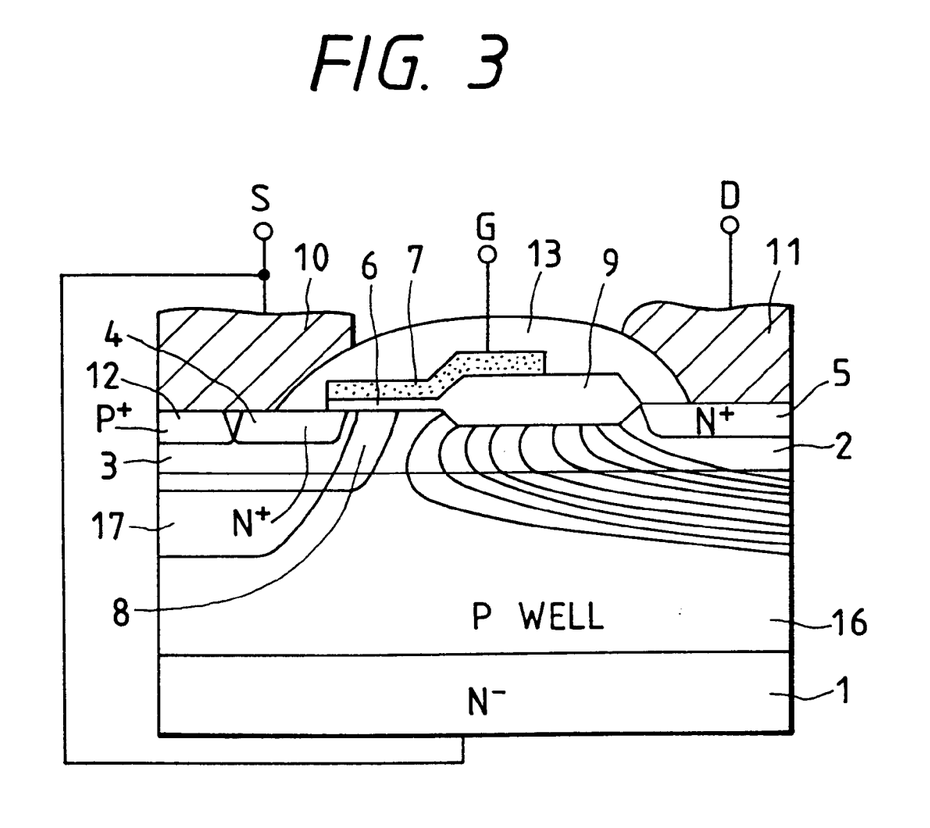
FIG. 3 an illustration of the FIG. 1 structure available for explaining a potential state at the application of a reverse voltage.

The reduced surface field strength type LDMOS as shown in FIG. 1 has a high breakdown voltage and a low ON resistance and can prevent the breakdown of the channel formation portions at the time of the application of a reverse voltage occurring when an L load comes into connection with a drain electrode, as will be described with reference to FIG. 2. In the case that the L load 15 is connected to the drain electrode, if the voltage to be applied to a gate electrode 7 is lowered to make a switch-off condition, the drain electrode 11 is subjected to a reverse voltage. In this case, although there exist a parasitic diode VZ1 made between the N well 2 and the P well 16 and a parasitic diode VZ2 established between the N well 2 and a channel P well 3, the parasitic diode VZ1 first gets into breakdown. That is, this application of the reverse voltage establishes the electric potential distribution in the N well 2 and the P well 16 as shown in FIG. 3 where the electric potential gradient in the vertical direction, i.e., toward the substrate becomes greater than that in the horizontal direction from the drain region 5 to the source region 4, and that is why the breakdown of the parasitic diode VZ1 first occurs. In this case, the voltage within the P well 16 rises due to the presence of a resistor R2 so that a parasitic diode VZ3 between the P well 16 and the N-type substrate 1 comes into its ON state and a parasitic bipolar transistor 18 made up of the N well 2, the P well 16 and the N-type substrate 1 takes its ON state, thus making a current flow in the direction of the substrate with a wide area. For this reason, the current can be dispersed to suppress the heating due to the current flow, with the result that the breakdown of the elements at the channel formation portions having a low breakdown voltage characteristic is avoidable, besides the breakdown voltage characteristic of the elements improves.

Furthermore, a base 17 is provided to include the source region 4 and to reach the P well 16 so that a current I flows from the P well 16 to the source side. This further makes the current hard to flow at the channel formation portions.

Incidentally, in cases where a sufficient current can flow through a current-carrying path toward the substrate, the base 17 does not need to be provided.

Although in the above-described structure the current is made to flow toward the substrate by means of the parasitic bipolar transistor 18, if the P well 16 has a sufficiently thin configuration in the direction of the substrate, the current can flow toward the substrate by the punchthrough without depending on the parasitic bipolar operation.

Figure 4:
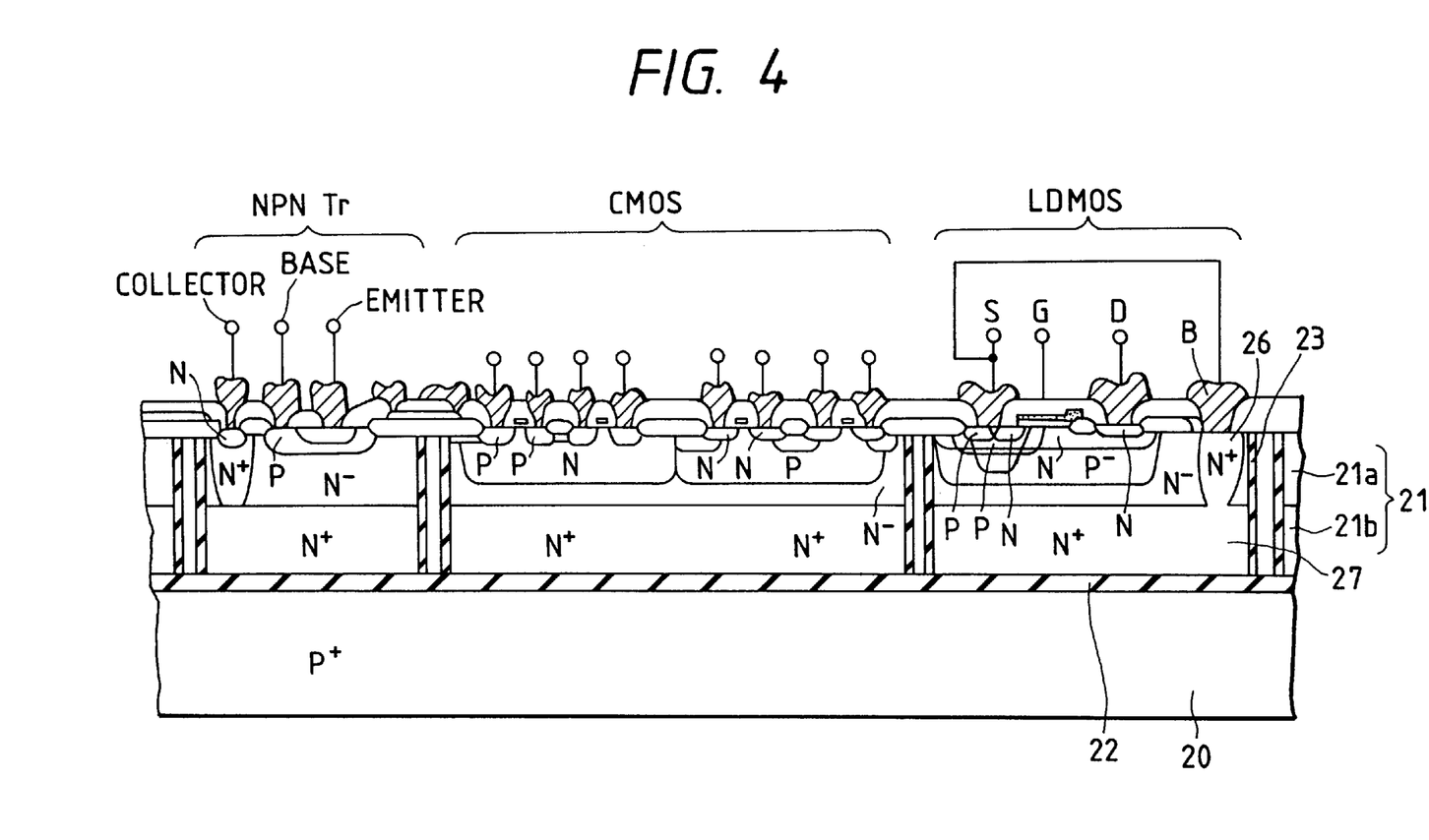
FIG. 4 is a cross-sectional view showing a structure in which the FIG. 1 LDMOS, a CMOS and an NPNTr are formed on the same substrate.

FIG. 4 shows a structure where the above-mentioned reduced surface field strength type LDMOS, together with a CMOS and an NPNTr, is formed on one substrate. The FIG. 4 structure is an SOI (Silicon On Insulator) structure. More specifically, an N-type substrate 21 made by forming an N⁻ layer (corresponding to the N-type substrate 1 in FIG. 1) 21a on an N⁺ substrate 21b and a P-type substrate 20 are adhered through an insulating film 22 such as $SiO_2$ to produce a substrate, and trench grooves 23 are made in that substrate and oxide films are provided within the trench grooves 23 to define a plurality of element-separated element regions so that the LDMOS, the CMOS and NPNTr are formed in the element regions, respectively.

Figure 5A:
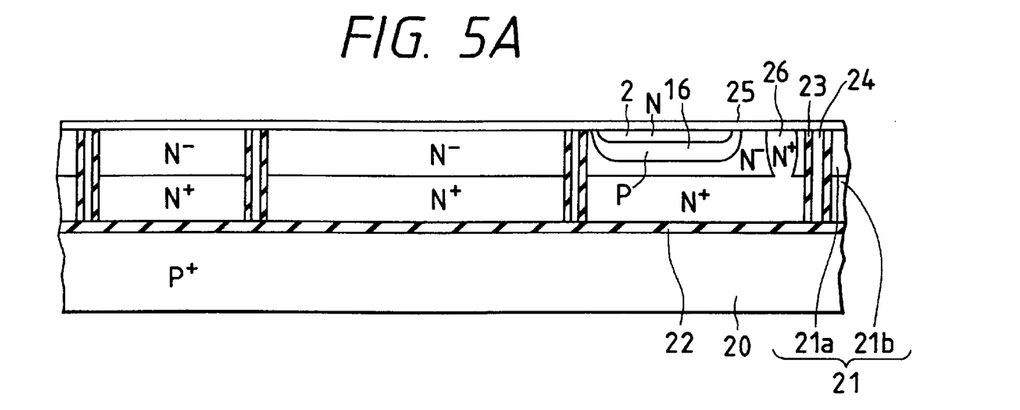
FIGS. 5A to 5C are illustrations for describing a manufacturing method of the device as shown in FIG. 4.

A method of manufacturing the FIG. 4 device will be taken hereinbelow with reference to FIGS. 5A to 5C and 6A to 6C. First of all, the trench grooves 23 are made in the above-mentioned adhered substrate prepared so that the oxide films are formed within the trench grooves 23 and further a polycrystalline silicon 24 is embedded therein. In this state, an oxide film 25 appears on the N-type substrate 21 surface. Further, as shown in FIG. 5A, a deep N⁺ layer 26 is formed in the LDMOS formation area, and subsequently the ion implantation is done to produce the P well 16 and the N well 2, moreover the simultaneous diffusion is carried out. In this case, a boron (B) is employed for the P well, while arsenic (As) is used for the N well. Owing to the difference between the diffusion coefficients thereof, the P well reaches a deep position whereas the N well remains at a shallow position. In this step, since the simultaneous diffusion of the boron and the arsenic takes place, the number of the masks necessary therefor is one.

For the ion implantation, the boron dose is $3 \times 10^{12}$ to $1 \times 10^{13}$ atom/cm², and the arsenic dose is $3 \times 10^{12}$ to $1 \times 10^{13}$ atom/cm². Further, in the case of diffusing the implanted ions, the drive-in is done at a temperature of 1200° C. for approximately 600 minutes. In addition, as the condition for the RESURF structure, the impurity concentration in the depth direction from the N well layer 2 surface to the PN junction made together with the P well layer 16 is expressed according to the following equation (1).

$$\int_0^{xj} Nd(x)dx < 1 \text{ to } 2 \times 10^{12} \text{cm}^{-2}$$

where Nd(x)dx represents an impurity concentration per unit volume, x designates the depth, and xj depicts the PN junction depth of the N well layer 2 and the P well layer 16.

Figure 5B:
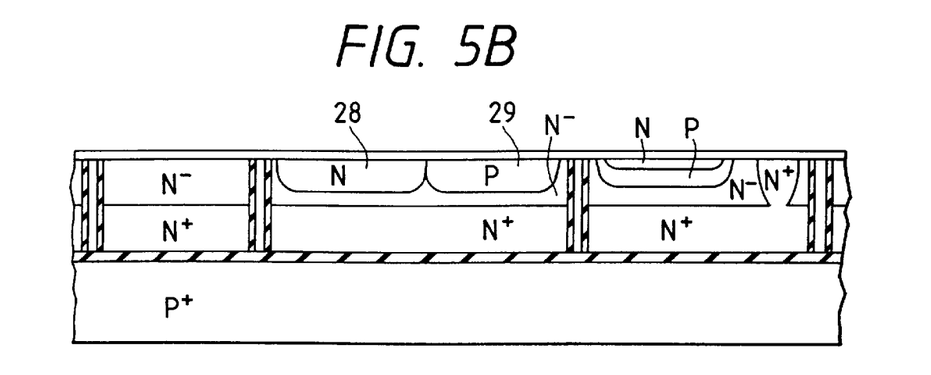
Figure 5C:
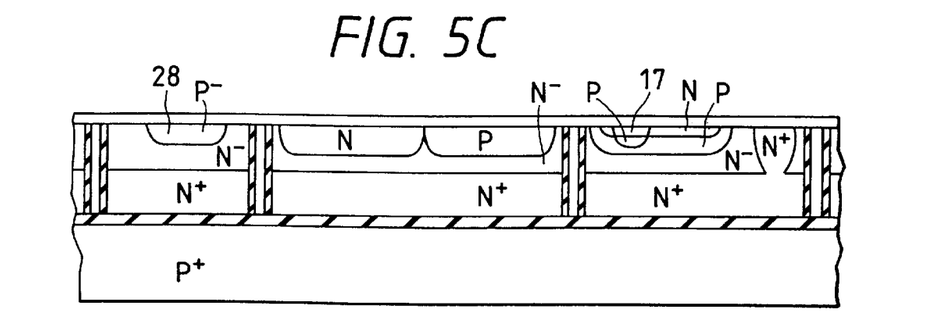

Secondly, as shown in FIG. 5B the ion implantation is performed in the CMOS formation area to produce a P well 29 and an N well 28, before diffused. Thereafter, as shown in FIG. 5C the ion implantation is carried out in the NPNTr formation area to produce a base 28 through the drive-in. At this time, if necessary, a base 17 is also provided in the LDMOS formation area in like manner.

Figure 6A:
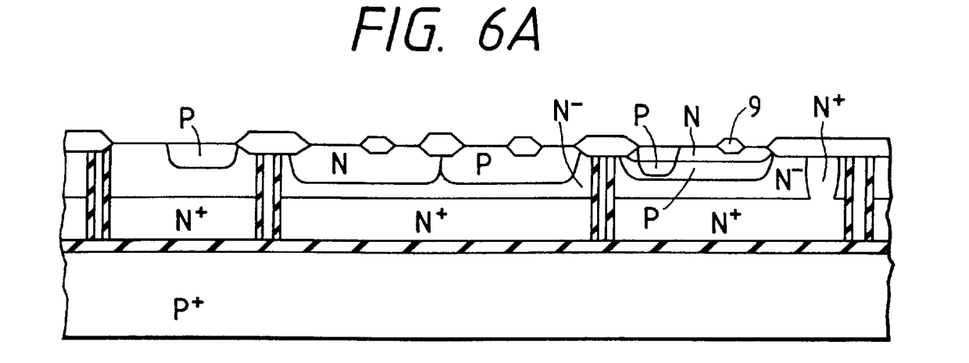
FIGS. 6A to 6C are illustrations of manufacturing steps subsequent to the manufacturing steps as shown in FIGS. 5A to 5C.
Figure 6B:
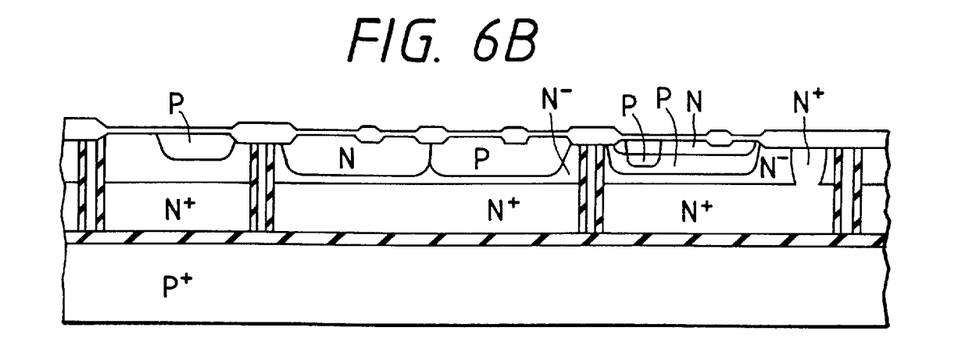
Figure 6C:
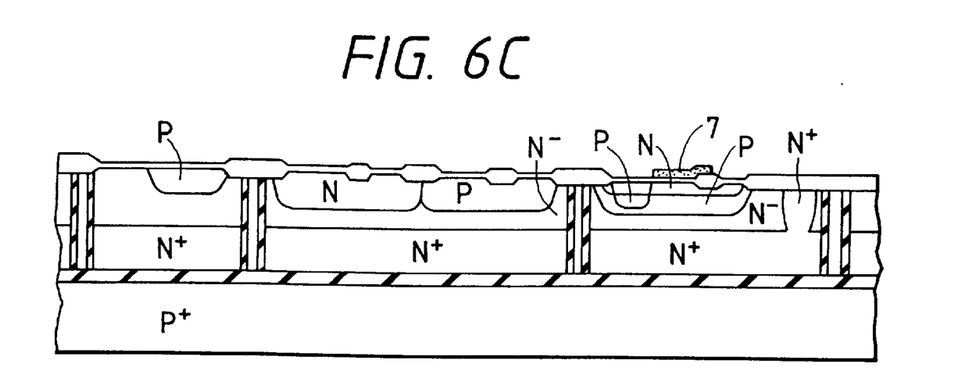

Furthermore, as shown in FIG. 6A the operation comes into the LOCOS oxidization whereby an LOCOS oxide film 9 is formed in the LDMOS formation area, and subsequently the oxidization of the substrate surface is carried out to produce a gate oxide film 6 of the LDMOS (FIG. 6B). In addition, Poly Si is formed in the substrate surface and phosphorus is doped, and further the photoetching processing for the patterning is performed to form a gate electrode 7 of the LDMOS (FIG. 8C). Thereafter, the LDMOS, the CMOS and NPNTr are successively formed through common element formation steps, finally obtaining the structure as shown in FIG. 4. Incidentally, in the LDMOS formation area, the gate is used as a mask so that the channel P well 8 and the source region 4 are diffusion-formed in the N well 2.

Through the use of the above-described manufacturing method, there was produced a reduced surface field strength type LDMOS where the length of the LOCOS oxide film was 2 mm, the uppermost surface concentration of the P well 6 was $8 \times 10^{15}$ to $2 \times 10^{16}$/cm³, the uppermost surface concentration of the N well 2 was $3 \times 10^{16}$ to $6 \times 10^{16}$/cm³, and the depth of the N well 2 was approximately 1.5 to 2.0 mm. In this case, the breakdown voltage between the source and the drain could assume approximately 70 to 80 V and the breakdown voltage between the N well 2 and the P well 16 could result in being approximately 65 V.

In the above-mentioned reduced surface field strength type LDMOS, the P-type first well and the N-type second well are formed in the N-type semiconductor layer 21 to produce a double well structure, with the result that the reduced surface field strength LDMOS, together with the NPNTr using the N-type semiconductor layer 21 as its collector layer, can be formed on the same substrate.

Figure 7:
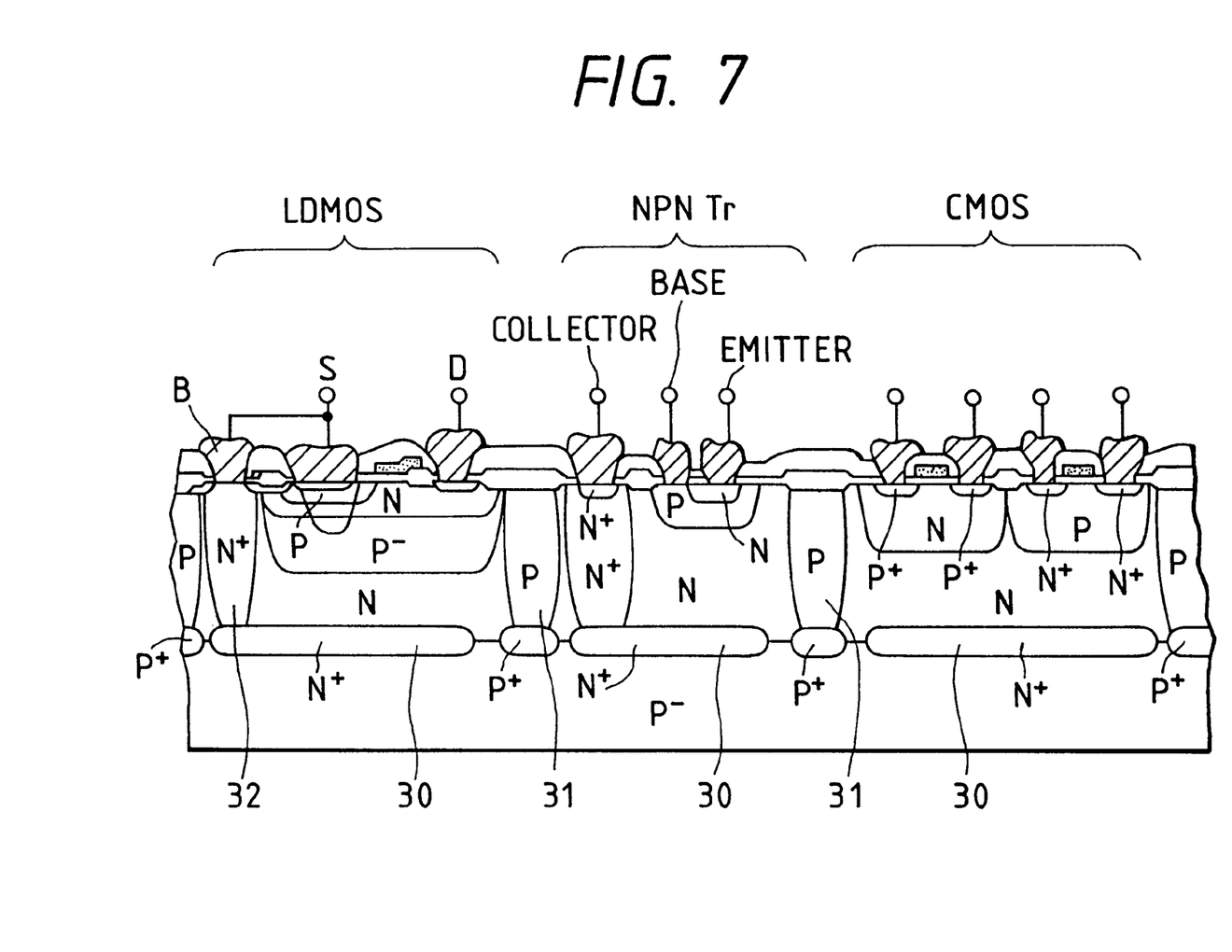
FIG. 7 is a cross-sectional view showing a device according to another embodiment of this invention.

Although in FIG. 4 the SOI structure is employed and the element separation is made using the insulating film 22 and the trench grooves 23, it is also possible that the element separation is accomplished using element separation buried layers 30 and element separation P layers 31 as shown in FIG. 7.

In the LDMOS as shown in FIG. 4 or 7, when the path for leading the breakdown current toward the substrate at the occurrence of the reverse voltage is set up so that as shown in FIG. 4 the current passes through an N⁺ diffused layer 27 brought into contact with the insulating layer 22 and the deep N⁺ layer 26 and further flows from a bottom electrode B located on the substrate surface to the ground or as shown in FIG. 7 the current flows through the buried N⁺ layer 30 and a deep N⁺ layer 32 and further exits from a bottom electrode B to the ground, in addition to the above-mentioned effects the following effects are attainable. That is, even in the case of the prior reduced surface field strength type LDMOS as shown in FIG. 15, if the adjustment is made of the distance of the drift region from the drain region 5 to the channel P well 3 or the concentration and depth of the N well 2, when a reverse voltage causing that a reverse bias is made between the drain region 5 and the channel P well region 3 is applied to the drain electrode 11, it is considered that the current flows toward the substrate as well as the above-described embodiment. However, in the case that like the LDMOS shown in FIG. 4 or 7 the breakdown current is made to flow from the substrate surface to the ground, although there is the current-carrying path to the bottom electrode as shown in FIG. 4 or 7, a larger current-carrying path is made in the channel P well 3 with a short current path. For this reason, as mentioned in the Description of Prior Art a large current due to the parasitic transistor finally flows through the channel region, with the result that, even if the reverse voltage is low, the elements in the substrate surface can break down due to the heat. Thus, in the case that as shown in FIG. 4 or 7 the breakdown current is made to flow from the substrate surface to the ground, the N-type layer is provided under the P well 16 to produce the parasitic transistor toward the substrate and the current flow is established using a conductivity type N layer different from the channel P well. In this case, the breakdown current does not flow through the channel P well, and hence the breakdown of the elements due to the heat in the vicinity of the substrate surface is avoidable. Incidentally, as another example of the electrode on the substrate surface, there is a bump electrode used for flip chips or the like. This can exhibit the same effects.

Figure 8:
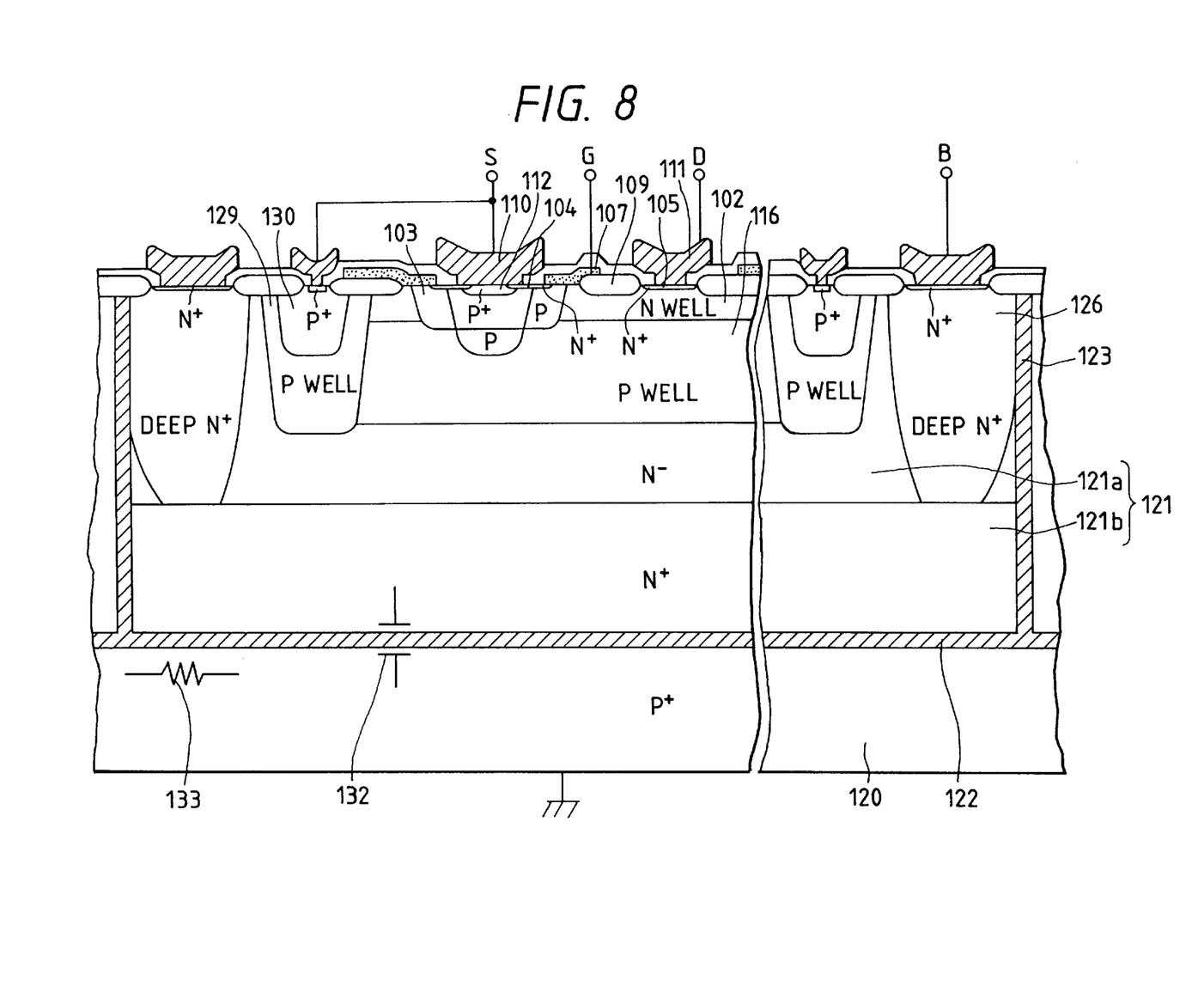
FIG. 8 is a cross-sectional view showing a structure of a semiconductor device including a reduced surface field strength type LDMOS according to a further embodiment of the present invention.
Figure 9:
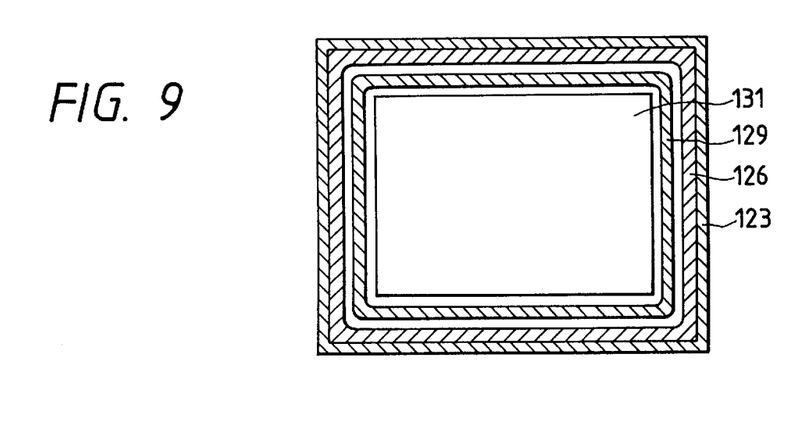
FIG. 9 is a plan view showing the FIG. 8 reduced surface field strength type LDMOS.

Moreover, a description will be made hereinbelow of a concrete structure of a reduced surface field strength type LDMOS formed in an insulated and separated element region according to a further embodiment of the present invention. FIG. 8 is a cross-sectional view showing the structure of the reduced surface field strength type LDMOS according to this embodiment, where the portion other than a deep N$^+$ diffused layer 126 and an N+ substrate 121b corresponds to the reduced surface field strength type LDMOS shown in FIG. 1. In the FIG. 8 structure, a P well 129 and a base 130 are provided in order to fix the electric potential of a P well 116 to the source electric potential. FIG. 9 is a plan view showing the structure shown in FIG. 8. In an element region separated and formed by an oxide film 123 to have an island-like configuration, there is provided a cell region 131 in which a plurality of LDMOS each described above are formed (more specifically, source regions and drain regions are alternately disposed to form a grating-like configuration and gates are located therebetween). Around the cell region 131 there is provided the P well 129 for fixing the electric potential of the P well 116 to the source electric potential. In addition, the deep N$^+$ diffused layer 126 is provided around the P well 129 to come into contact with the oxide film 123.

A bottom electrode B is connected to the deep N$^+$ diffused layer 126, and the electric potential of this bottom electrode B is fixed to fix the electric potentials of the deep N$^+$ diffused layer 126 and the N$^+$ substrate 121b. In an insulating film 122, as shown in FIG. 8 there exists a parasitic capacitor 132, while fixing the electric potentials of the deep N$^+$ diffused layer 126 and the N$^+$ substrate 121b can suppress the variation of the electric potential of a P-type substrate 120 even if the LDMOS performs its switching operation.

Figure 10C:
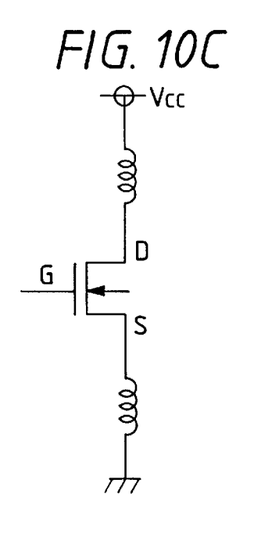

In the case that the load is driven by the low side switch type as shown in FIG. 10A, the bottom electrode B is connected to the GND. In this case, as described above, when a reverse voltage is applied to a drain electrode 111, a current flows toward the substrate. This current passes through the N$^+$ substrate 121b and the deep N$^+$ diffused layer 126 and exits from the bottom electrode B. Further, in the case that the load is driven by the high side switch type as shown in FIG. 10B, the bottom electrode B is connected to the power supply. Accordingly, even with the low side switch type or the high side switch type, the electric potential of the bottom electrode B is fixed so that the occurrence of the switching noises is suppressible. Moreover, in the case that as shown in FIG. 10C loads are respectively coupled to both the ends of the LDMOS, the bottom electrode B is connected to the power supply.

Figure 10D:
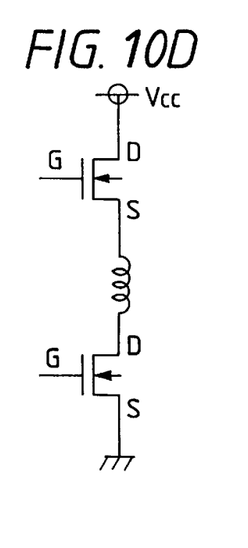
Figure 10E:
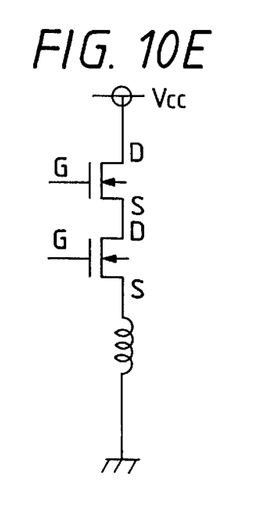

In addition, in the case that as shown in FIG. 10D two LDMOSs are respectively provided in the high and low sides for driving a load, in the LDMOS in the high side its bottom electrode B is connected to the power supply, whereas in the LDMOS in the low side its bottom electrode B is coupled to the GND. Further, in the case that as shown in FIG. 10E two LDMOSs are provided in the high side to drive a load, both are connected to the power supply.

Figure 11:
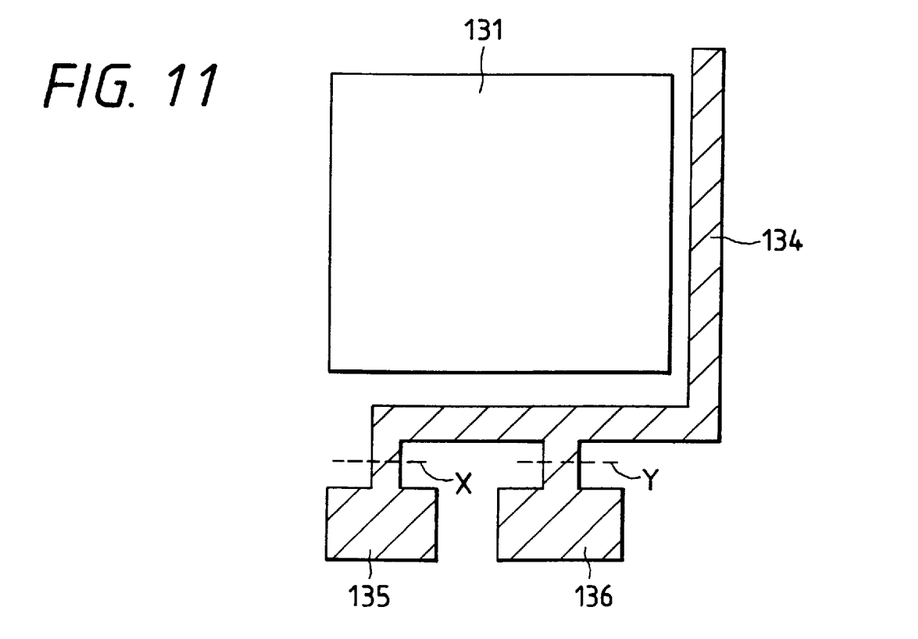
FIG. 11 shows an example which allows an LDMOS to be selectively used for any one of a low side switch type and a high side switch type.
Figure 12:
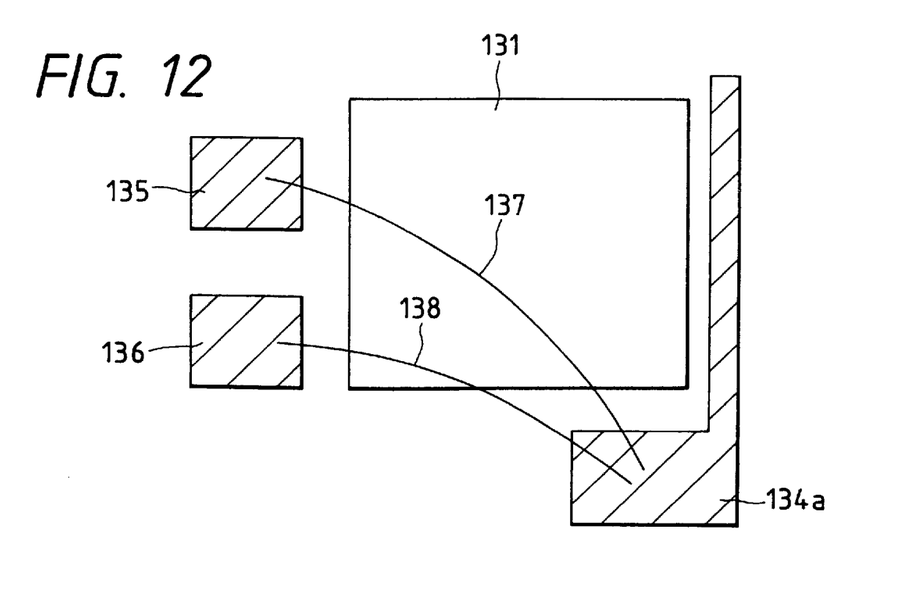
FIG. 12 shows another example which allows an LDMOS to be selectively used for any one of a low side switch type and a high side switch type.
Figure 13:
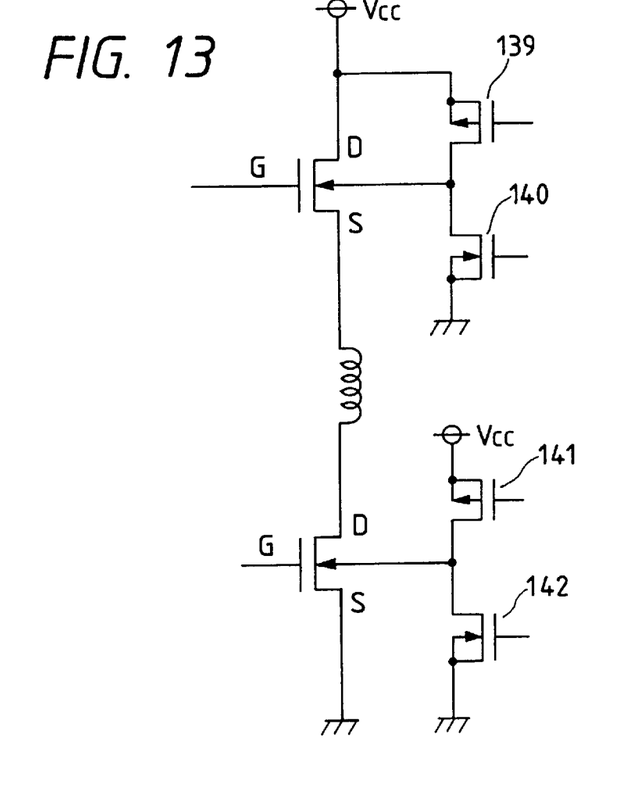
FIG. 13 shows a further example which allows an LDMOS to be selectively used for any one of a low side switch type and a high side switch type.

For the connection of the bottom electrode B to the power supply or the GND, the pattern of the bottom electrode B is designed so that the bottom electrode B is previously connected to the electrode pattern of the power supply or the GND. In this case, if using the following structure or arrangement, the LDMOS can freely selected between the low side switch type and the high side switch type. That is, for example, as shown in FIG. 11 an electrode pattern 134 of a bottom electrode B is formed to be connected to an electrode pad 135 of a source electrode and further to an electrode pad 136 of a drain electrode. With this structure, one of the low side switch type and the high side switch type can be selected in such a manner that a portion is cut by the trimming along one of dotted lines X and Y. More specifically, if a portion of the electrode pattern 134 is cut along the dotted line A, the bottom electrode B is connected to the drain side, i.e., the power supply to establish the high side switch type. On the other hand, if being cut along the dotted line B, the bottom electrode B is connected to the source side, i.e., the GND to produce the low side switch type. It is also possible that the electrode pattern 134 of the bottom electrode B is previously coupled through fuses to the electrode pads 135, 136 of the source electrode and the drain electrode and then one of the fuses is melted to be cut to select one of the high side switch type and the low side switch type. Further, it is also appropriate that as shown in FIG. 12 an electrode pad 134a of the bottom electrode B is wire-bonded through a wire 137 or 138 to an electrode pad 135 of a source electrode or an electrode pad 136 of a drain electrode to establish the low side switch type or the high side switch type. Still further, it is also possible to set the electric potential of the bottom electrode B through the use of an MOS transistor. For example, in relation to the arrangement shown in FIG. 10D, electric potential selection MOS transistors 139 to 142 are provided as shown in FIG. 13 so that the MOS transistors 139 and 142 are brought into the ON states while the MOS transistors 140 and 141 are set to the OFF conditions. With this arrangement, the bottom electrode B of the LDMOS in the high side can be connected to the power supply whereas the LDMOS in the low side can be connected to the GND. In this instance, in place of the MOS transistor, a bipolar transistor can also be used as the transistor for the selection of the electric potential. In FIG. 13, for an easy understanding of the circuit, the bottom electrode B is illustrated like a back gate.

In the P-type substrate 120 there exists a substrate resistor 133 as shown in FIG. 8. However, if the impurity concentration of the P-type substrate 120 is heightened (approximately $1 \times 10^{18}$ cm$^{-3}$ $^{to}$ $1 \times 10^{20}$ cm$^{-3}$) to lower the substrate resistance so that the current can easily flow from the P-type substrate 20 to the GND, the influence of the switching noises is reducible. Further, although the above-described embodiment uses the reduced surface field strength type LDMOS as shown in FIG. 1, this invention is applicable to the LDMOSs shown in FIGS. 14 and 15 and other power semiconductor elements. Still further, the LDMOS is not limited to the N-channel type but can be of the P-channel type.

It should be understood that the foregoing relates to only preferred embodiments of the present invention, and that it is intended to cover all changes and modifications of the embodiments of the invention herein used for the purpose of the disclosure, which do not constitute departures from the spirit and scope of the invention.

What is claimed is:

1. A semiconductor device having a power transistor structure comprising:

a semiconductor layer of a first conductivity type;

a first well of a second conductivity type disposed on said semiconductor layer;

a second well of the first conductivity type disposed at a surface region of said first well;

a drain region disposed within said second well;

a channel well region of the second conductivity type disposed at the surface region to be connected to said first well;

a source region of the first conductivity type disposed within said channel well region;

a gate electrode disposed over a surface portion of said channel well region between said source region and said second well where said drain region is disposed, thereby said second well serving as a drift region; and an electrode electrically connected to said semiconductor layer to maintain a potential on said semiconductor layer, wherein a parasitic bipolar transistor structure collectively formed by said second well, said first well and said semiconductor layer is designed to create a vertical current-carrying path from said second well through said first well and said semiconductor layer is designed to create a vertical current-carrying path from said second well through said first well to said semiconductor layer when an excessive voltage is applied to said drain region, and wherein said source region and said semiconductor layer are set to be electrically equipotential via said electrode.

2. A device as defined in claim 1, wherein said parasitic bipolar transistor structure is so designed as to cause a breakdown of a PN junction between said first and second wells and turn on to thereby serve as said vertical current-carrying path.

3. A device as defined in claim 1, wherein said parasitic bipolar transistor structure is so designed as to cause a punch-through phenomenon between said second well and said semiconductor layer to thereby establish said vertical current-carrying path.

4. A device as defined in claim 1, further comprising a base region of the second conductivity type disposed to overlap with a portion of said channel well region beneath said source region and contact down to said first well.

5. A device as defined in claim 1, wherein said semiconductor layer comprises an upper layer having a relatively low impurity concentration and encompassing said first well, and a lower layer having a relatively high impurity concentration and disposed entirely under said first well with said upper layer interposed therebetween.

6. A device as defined in claim 5, further comprising a deep region of the first conductivity type disposed in said upper layer of said semiconductor layer to contact down to said lower layer of said semiconductor layer.

7. A device as defined in claim 6, wherein said electrode for said semiconductor layer directly contacts said deep region.

8. A device as defined in claim 1, further comprising a first annular region of the second conductivity type surrounding said surface region of said first well where said second well, said drain region, said channel well region and said source region are disposed, said first annular region contacting down to said first well.

9. A device as defined in claim 8, further comprising a first annular electrode directly contacting said first annular region, said first annular electrode being electrically connected with said source region.

10. A device as defined in claim 1, further comprising a second annular region of the first conductivity type surrounding said surface region of said first well where said second well, said drain region, said channel well region and said source region are disposed, said second annular region contacting down to said semiconductor layer and being isolated from said second well.

11. A device as defined in claim 10, further comprising a second annular electrode directly contacting said second annular region, said second annular electrode serving as said electrode for said semiconductor layer.

12. A device as defined in claim 9, further comprising a second annular region of the first conductivity type surrounding said first annular region, said second annular region contacting down to said semiconductor layer.

13. A device as defined in claim 12, further comprising a second annular electrode directly contacting said second annular region, said second annular electrode serving as said electrode for said semiconductor layer.

14. A device defined in claim 1, wherein said semiconductor layer and said first well are disposed within a semiconductor island, said semiconductor island being disposed on a supporting semiconductor substrate with an insulation film interposed therebetween.

15. A device as defined in claim 14, further comprising another semiconductor island disposed on said supporting semiconductor substrate with said insulation film interposed therebetween, a semiconductor element being formed in said other semiconductor island.

16. A semiconductor device comprising:

a supporting semiconductor substrate;

an insulation film disposed on said supporting semiconductor substrate;

a buried semiconductor layer of a first conductivity type disposed on said supporting semiconductor substrate with said insulation film interposed therebetween;

a first well of a second semiconductor type disposed on said buried semiconductor layer;

a second well of the first conductivity type disposed at a surface region of said first well;

a drain region disposed within said second well;

a channel well region of the second conductivity type disposed at the surface region to be connected to said first well;

a source region of the first conductivity type disposed within said channel well region;

a gate electrode disposed over a surface portion of said channel well region between said source region and said second well where said drain region is disposed, thereby said second well serving as a drift region;

a electrode electrically connected to said buried semiconductor layer to maintain a fixed potential on said buried semiconductor layer; and a base region of the second conductivity type disposed to overlap with a region of said channel well region beneath said source region and contact down to said first well.

17. A device as defined in claim 16, wherein said buried semiconductor layer comprises an upper layer having a relatively low impurity concentration and encompassing said first well, and lower layer having a relatively high impurity concentration and disposed entirely under said first well with said upper layer interposed therebetween.

18. A device as defined in claim 17, further comprising an annular deep region of the first conductivity type disposed in said upper layer of said buried semiconductor layer to contact annular deep region of the first conductivity type disposed in said upper layer of said buried semiconductor layer to contact down to said lower layer of said buried semiconductor layer.

19. A device as defined in claim 18, wherein said electrode for said buried semiconductor layer directly contacts said annular deep region.

20. A device as defined in claim 16, further comprising a first annular region of the second conductivity type surrounding said surface region of said first well where said second well, said drain region, said channel well region and said source region are disposed, said first annular region contacting down to said first well.

21. A device as defined in claim 20, further comprising a first annular electrode directly contacting said first annular region, said first annular electrode being electrically connected with said source region.

22. A device as defined in claim 21, further comprising a second annular region of the first conductivity type surrounding said first annular region, said second annular region contacting down to said buried semiconductor layer.

23. A device as defined in claim 22, further comprising a second annular electrode directly contacting said second annular region, said second annular electrode serving as said electrode for said buried semiconductor layer.

24. A device as defined in claim 16, wherein a load is connected to said drain region to establish a low-side switch type and said electrode for said buried semiconductor layer is electrically connected to said source region.

25. A device as defined in claim 16, wherein a load is connected to said source region to establish a high-side switch type and said electrode for said buried semiconductor layer is electrically connected to said drain region.

26. A device as defined in claim 16, wherein said electrode for said buried semiconductor layer is electrically connected to a ground potential or a power supply.

27. A semiconductor device having a power transistor structure comprising:

a semiconductor layer of a first conductivity type;

a first well of a second conductivity type disposed on said semiconductor layer;

a second well of the first conductivity type disposed at a surface region of said first well;

a drain region disposed within said second well;

a channel well region of the second conductivity type disposed at the surface region to be connected to said first well;

a source region of the first conductivity type disposed within said channel well region;

a gate electrode disposed over a surface portion of said channel well region between said source region and said second well where said drain region is disposed, thereby said second well serving as a drift region;

an electrode electrically connected to said semiconductor layer to maintain a potential on said semiconductor layer, wherein a parasitic bipolar transistor structure collectively formed by said second well, said first well and said semiconductor layer is designed to create a vertical current-carrying path from second well through said first well to said semiconductor layer when an excessive voltage is applied to said drain region; and a base region of the second conductivity type disposed to overlap with a portion of said channel well region beneath said source region and contact down to said first well.

\* \* \* \* \*